(12) United States Patent
Cho

(10) Patent No.: US 10,748,457 B2
(45) Date of Patent: Aug. 18, 2020

(54) DISPLAY DEVICE

(71) Applicant: LG Display Co., Ltd., Seoul (KR)

(72) Inventor: SeokHyo Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/503,084

(22) Filed: Jul. 3, 2019

(65) Prior Publication Data

US 2020/0013317 A1  Jan. 9, 2020

(30) Foreign Application Priority Data

Jul. 3, 2018 (KR) .................. 10-2018-0076894

(51) Int. Cl.
| | | |
|---|---|---|
| *G09F 9/30* | (2006.01) | |
| *H05K 5/00* | (2006.01) | |
| *H05K 5/02* | (2006.01) | |
| *H01L 27/32* | (2006.01) | |
| *H01L 51/00* | (2006.01) | |

(52) U.S. Cl.
CPC ........... *G09F 9/301* (2013.01); *H05K 5/0017* (2013.01); *H05K 5/0217* (2013.01); *H01L 27/32* (2013.01); *H01L 51/0097* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,180,665 | B2 * | 2/2007 | Daniel | G06F 1/1601 |
| | | | | 160/373 |
| 9,519,313 | B2 * | 12/2016 | Kim | G06F 1/166 |
| 9,743,542 | B2 * | 8/2017 | Heo | H05K 5/0217 |
| 9,756,757 | B2 * | 9/2017 | Park | G09F 9/301 |
| 9,772,657 | B2 * | 9/2017 | Takayanagi | G06F 1/1615 |
| 9,844,152 | B2 * | 12/2017 | Heo | G02F 1/133305 |
| 9,864,412 | B2 * | 1/2018 | Park | G06F 1/1656 |
| 10,111,344 | B2 * | 10/2018 | Han | H05K 1/028 |
| 10,111,346 | B2 * | 10/2018 | Seo | G06F 3/044 |
| 10,299,391 | B2 * | 5/2019 | Kim | G03B 21/58 |
| 10,314,183 | B2 * | 6/2019 | Heo | H05K 5/0017 |
| 10,420,227 | B2 * | 9/2019 | Lee | H05K 5/0017 |
| 10,426,046 | B2 * | 9/2019 | Hayk | H05K 5/0217 |

(Continued)

FOREIGN PATENT DOCUMENTS

| | | |
|---|---|---|
| EP | 1 713 047 A1 | 10/2006 |
| EP | 3 173 897 A1 | 5/2017 |

(Continued)

*Primary Examiner* — Lisa Lea-Edmonds
(74) *Attorney, Agent, or Firm* — Seed IP Law Group LLP

(57) ABSTRACT

Provided is a display device. The display device includes: a flexible display panel, a roller fixed to a lower edge of the display panel, a plurality of links having one end connected to an upper edge of the display panel, a driving unit which is disposed proximate the roller and configured to rotate the roller, and an elastic member which is connected to the other end of each of the plurality of links and disposed outside of the roller. Accordingly, the force of the driving unit is directly transmitted to the roller and the force of the elastic member is directly transmitted to the links, such that the configuration and operation of manipulating the display device between a rolled configuration and an unrolled configuration is simplified.

20 Claims, 9 Drawing Sheets

(56) References Cited

U.S. PATENT DOCUMENTS

| | | | | |
|---|---|---|---|---|
| 10,439,154 B2* | 10/2019 | Kim | ............... | G06F 1/1652 |
| 10,444,613 B2* | 10/2019 | Seo | ............... | G09F 9/301 |
| 10,448,521 B2* | 10/2019 | Seo | ............... | H05K 1/0203 |
| 10,506,726 B2* | 12/2019 | Kang | ............... | G06F 1/1601 |
| 2014/0247544 A1* | 9/2014 | Ryu | ............... | G09F 11/18 |
| | | | | 361/679.01 |
| 2019/0141843 A1* | 5/2019 | Park | ............... | H05K 5/0217 |
| 2019/0198783 A1* | 6/2019 | Kim | ............... | H01L 23/4985 |
| 2019/0246512 A1* | 8/2019 | Heo | ............... | G06F 1/1681 |

FOREIGN PATENT DOCUMENTS

| | | |
|---|---|---|
| JP | 2010-78684 A | 4/2010 |
| KR | 2001-0081786 A | 8/2001 |

* cited by examiner

DISPLAY DEVICE

CROSS-REFERENCE TO RELATED APPLICATIONS

This application claims the priority of Korean Patent Application No. 10-2018-0076894 filed on Jul. 3, 2018, in the Korean Intellectual Property Office, the disclosure of which is incorporated herein by reference, in its entirety.

BACKGROUND

Technical Field

The present disclosure relates to a display device, and more particularly, to a rollable display device with a driving assembly and a lifting assembly for manipulating a display panel between a rolled configuration and an unrolled configuration.

Description of the Related Art

Organic light emitting display (OLED) devices are known for use as computer monitors, televisions, or cellular phones. OLED devices are a self-emitting device and thus produce images without a separate light source, unlike liquid crystal display (LCD) devices and other types of display devices.

Over time, an applicable range of display devices has been diversified to personal digital assistants as well as monitors of computers and televisions, including display devices with a large display area, a reduced volume, and a reduced weight.

Recently in the field of display devices, rollable display devices with a display panel and a wiring line on a flexible substrate are gaining interest as a next generation display device. Specifically, devices are of interest that are capable of displaying images even when the display device is in a rolled configuration. However, known display devices are unable to be precisely controlled between rolled and unrolled configurations. Moreover, known display devices include drive mechanisms for rolling and unrolling the display device that are inefficient, occupy a relatively large amount of space, and include additional components, which decrease efficiency of repair and replacement and increase the cost of the overall display device.

BRIEF SUMMARY

In various embodiments, the present disclosure provides a display device which precisely winds or unwinds a rollable display panel by precisely controlling a roller.

In various embodiments, the present disclosure provides a display device with a simplified structure in which forces from a driving assembly and a lifting assembly are directly transmitted to a roller and a link, respectively, to roll or unroll the rollable display panel without using an intermediate medium.

In one embodiment, the present disclosure provides a display device which reduces a volume of a motor configuration which winds or unwinds a display panel.

In one embodiment, the present disclosure provides a display device which increases a degree of freedom of design of a driving assembly and a lifting assembly by disposing a driving assembly and a lifting assembly outside of a display panel and a roller.

In one embodiment, the present disclosure provides a display device which adjusts a degree of flatness of at least a part of a display panel which is unwound from a roller.

The present disclosure is not limited to the above-mentioned examples, and other embodiments, which are not mentioned above, can be clearly understood by those skilled in the art from the following description.

According to one or more embodiments of the present disclosure, a display device includes: a display panel having a first edge and a second edge, a roller coupled to the first edge of the display panel, a plurality of links having a first end opposite a second end, each of the second ends of the plurality of links coupled to the display panel proximate the second edge of the display panel, a driving assembly disposed outside of the roller and configured to rotate the roller, and an elastic member coupled to the first end of each of the plurality of links, the elastic member disposed outside of the roller. Accordingly, a force generated by the driving unit is directly transmitted to the roller and a force generated by the elastic member is directly transmitted to the plurality of links, such that the configuration of the driving mechanism of the display device is simplified.

According to one or more embodiments of the present disclosure, a rollable display device includes: a roller, a display panel fixed to the roller, a plurality of links coupled to the display panel, the plurality of links configured to support the display panel in a flat and planar configuration, a driving unit mechanically coupled to the roller, and a lifting assembly configured to apply a force to the plurality of links, wherein during operation the driving unit rotates the roller to wind the display panel about the roller, and wherein during operation, the lifting unit acts with the force on the plurality of links to unfold the plurality of links. Accordingly, in order to wind the display panel around the roller, only the driving unit controls the roller, such that it is possible to more precisely control the roller.

Further details of the embodiments are included in the detailed description and the drawings.

According to the present disclosure, a display device in which a driving assembly directly rotates a roller to precisely control the roller is provided.

According to the present disclosure, in order to wind or unwind the rollable display panel, a driving assembly directly transmits a torque to a roller and a lifting assembly directly transmits a force to a plurality of links, which together simplify the configuration of the driving mechanism of the display device.

According to the present disclosure, a simplified driving unit is disposed to reduce an amount of space occupied by the driving unit.

According to the present disclosure, the driving assembly and the lifting assembly are disposed outside of, or exterior to, the roller, so that the driving assembly and the lifting assembly are easily accessible for repairs, replacement, and rearrangement, which increases a degree of freedom of design of the driving assembly and the lifting assembly.

According to the present disclosure, a degree of flatness of the display panel may be adjusted by adjusting a modulus of elasticity of an elastic member.

The embodiments of the present disclosure are not limited to the examples above, and more features of the embodiments are included in the present specification.

BRIEF DESCRIPTION OF THE DRAWINGS

The above and other embodiments, features and other advantages of the present disclosure will be more clearly understood from the following detailed description taken in conjunction with the accompanying drawings, in which.

DETAILED DESCRIPTION

Figure 1:
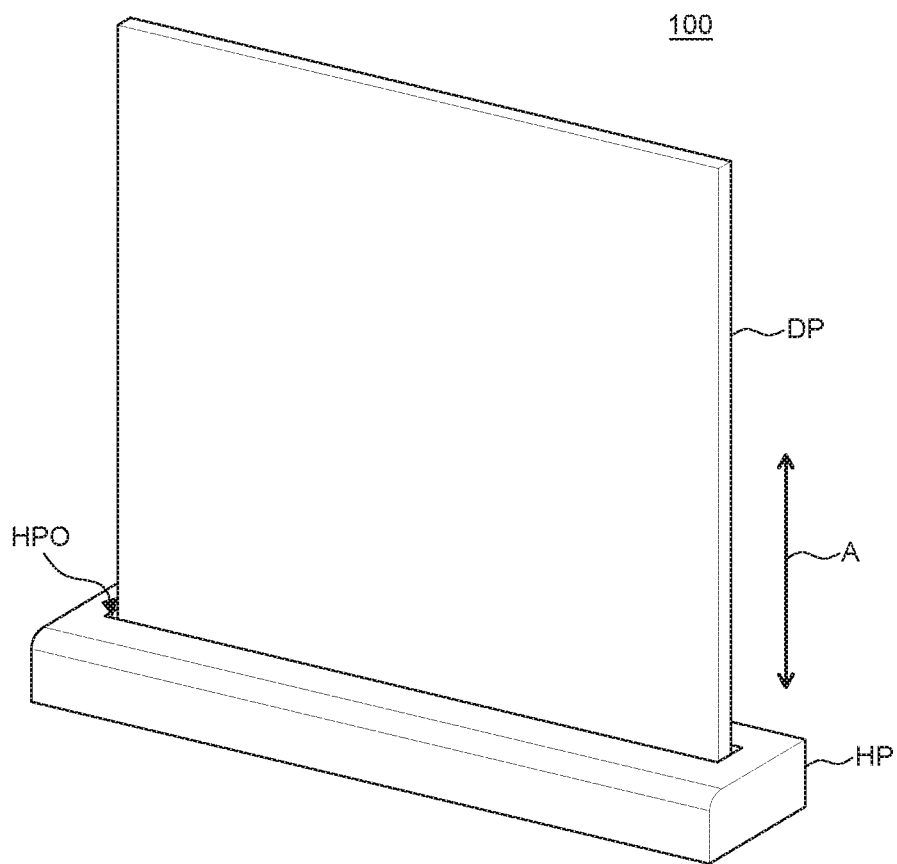
FIG. 1 is a perspective view of a display device in a fully unrolled configuration according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but can be implemented in various forms. The embodiments are provided by way of example only so that those skilled in the art can fully understand the embodiments of the present disclosure and the scope of the present disclosure. Therefore, the present disclosure is not limited to the disclosed embodiments, but will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification, unless the context dictates otherwise. Further, in the following description of the present disclosure, a detailed explanation of known related technologies may be omitted to avoid unnecessarily obscuring the embodiments of the present disclosure. Terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the relationship between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or there between.

Although the terms "first," "second," and the like are used for describing various components, these components are not confined by these terms. These terms are merely used for distinguishing one component from the other components. Therefore, a first component mentioned below may be a second component in accordance with the present disclosure.

A size and a thickness of each component illustrated in the drawings is provided only for convenience of description and understanding the illustrated embodiments, and the present disclosure is not limited to the size and the thickness of the component illustrated.

The features of various embodiments of the present disclosure can be partially or entirely adhered to or combined with each other and can be interlocked and operated in various ways, and the embodiments can be carried out independently of or in association with each other.

Hereinafter, embodiments of the present disclosure will be described in detail with reference to accompanying drawings.

Figure 2:
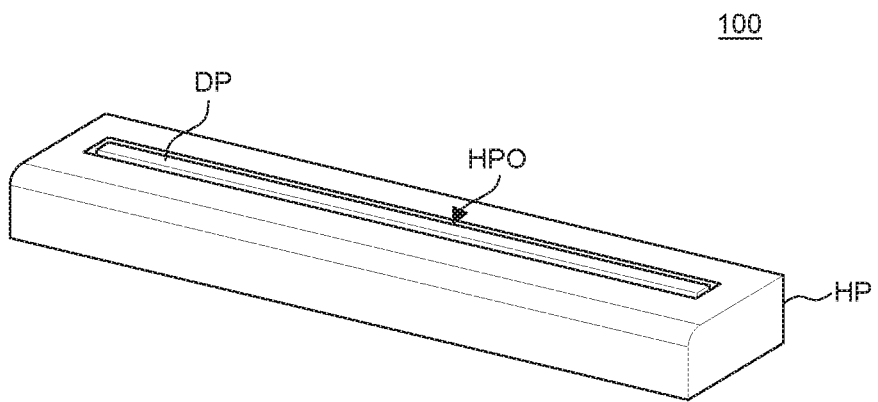
FIG. 2 is a perspective view of the display device of FIG. 1 in a fully rolled configuration according to the present disclosure.

FIG. 1 is a perspective view of a display device 100 in a fully unrolled configuration according to one embodiment of the present disclosure. FIG. 2 is a perspective view of the display device 100 in a fully rolled configuration according to one embodiment of the present disclosure. Referring to FIGS. 1 and 2, the display device 100 includes a display panel DP and a housing HP (which may be referred to herein as a housing unit HP), wherein the display panel DP is coupled to the housing unit HP, as described herein, and stored in the housing unit HP when not in use. When the display panel DP is in use, the display panel DP extends from the housing unit HP.

As an initial matter, the display device 100 described herein may be a display device 100 with a rollable or flexible display panel DP which is capable of displaying images in the rolled configuration. The display panel DP of the display device 100 may have a high flexibility as compared with a general display panel or device of the related art. Because of the flexibility and configurability of the rollable display panel DP described herein, a size and shape of the rollable display panel DP may be freely selected. Further, when the display device 100 is not in use, the display device 100, and more particularly the display panel DP, is manipulated from the unrolled configuration to the rolled configuration to be stored with a reduced volume relative to other known devices. In contrast, when the display device 100 is manipulated from a storage configuration to a use configuration (e.g. when the display device 100 is in use), the display panel DP of the display device 100 is manipulated from the rolled configured to the unrolled configuration.

The display panel DP displays images to a user. For example, in one embodiment, the display panel DP includes a display element, a circuit, a wiring line, and a component for driving the display element. In such an embodiment, since the display panel DP of the display device 100 is a rollable display panel DP, the display panel DP is configured to be manipulated between the rolled and unrolled configurations. For example, the display panel DP may be formed of a display panel and a back cover each having flexibility such that they can be manipulated between the rolled and unrolled configurations.

The display panel is a panel for displaying images to the user. The display panel may include a display element which displays images, a driving element which drives the display element, and wiring lines which transmit various signals to the display element and the driving element. The display element may be defined in different ways depending on a type of the display panel. For example, when the display panel is an organic light emitting display panel, the display element may be an organic light emitting diode which includes an anode, an organic light emitting layer, and a cathode. In an alternative embodiment, the display panel is a liquid crystal display panel, in which case the display element may be a liquid crystal display element.

A back cover is disposed on a rear surface of the display panel to support the display panel. The back cover may protect the display panel from damage or from debris or other materials from coming into contact with electronic components of the display panel and shorting the electronic components, such as the anode and cathode of an OLED display panel. In general, the back cover protects the display panel from harmful outside forces. The back cover is formed of a material that has a rigidity to support the display panel, but also that is flexible enough to be manipulated between the rolled and unrolled configurations with the display panel DP.

The housing unit HP is a case in which the display panel DP is accommodated when not in use. As will be described in further detail below, the housing unit HP further includes various electronic and mechanical components for manipulating the display panel DP between rolled and unrolled configurations. When the display device 100 and display panel DP are not in use, (e.g. when the display panel DP is in the rolled configuration), the display panel DP is received or accommodated in the housing unit HP. When in the use, the display panel DP is manipulated to the unrolled configuration such that the display panel DP extends from the housing unit HP. In other words, in the unrolled configuration, the display panel DP extends from the housing unit HP such that the display panel DP is positioned outside the housing unit HP.

The housing unit HP further includes an opening HPO. The opening HPO is preferably centrally disposed with respect to a top surface of the housing unit HP. The display panel DP moves between the rolled and unrolled configurations (e.g. from being positioned in the inside to the outside of the housing unit HP) through the opening HPO, as indicated by arrow A in FIG. 1. In one embodiment, the display panel DP moves in a vertical direction through the opening HPO of the housing unit HP between the rolled and unrolled configurations.

As will be described in further detail herein, the display panel DP of the display device 100 may be manipulated from a fully unrolled configuration as in FIG. 1 to a fully rolled configuration as in FIG. 2, or from a fully rolled configuration to a fully unrolled configuration.

FIG. 1 illustrates the fully unrolled configuration of the display panel DP of the display device 100. In the fully unrolled configuration, the display panel DP of the display device 100 extends from the housing unit HP such that the display panel DP is positioned outside of the housing unit HP. The fully unrolled configuration is defined as a state in which the display panel DP is unrolled and positioned outside of the housing unit HP to a maximum amount, such that it cannot be further unrolled any further without uncoupling from the housing unit HP. When the user activates the display device 100 such that images appear on the display panel DP, the display panel DP may be manipulated to the fully unrolled configuration, in which the display panel DP is flat and planar and preferably arranged vertically with respect to the housing unit HP, which is preferably arranged horizontal, or substantially horizontal. Moreover, the display panel DP extends from the housing unit HP such that the display panel DP is outside of the housing unit HP.

FIG. 2 illustrates the fully rolled configuration of the display panel DP of the display device 100. In the fully rolled configuration, the display panel DP of the display device 100 is received in the housing unit HP. The fully rolled configuration is fined as a state in which the display panel DP is rolled and received in the housing unit HP to a maximum amount, such that it cannot be further rolled without damaging one or more components of the display device 100. When the display device 100 is not in use (e.g. the user is not watching images on the display unit DP, it is advantageous from an aesthetic standpoint that the display panel DP is received in the housing unit HP and not positioned outside of the housing unit HP. Therefore, the display device 100, and more particularly the display panel DP, may be manipulated to the fully rolled configuration, in which the display panel DP is rolled to be accommodated in the housing unit HP. Further, when the display panel DP is in the fully rolled configuration and accommodated in the housing unit HP, a volume of the display unit DP (and the display device 100 generally) is reduced, such that the display device 100 maintains a pleasing aesthetic as well as a form factor that may easily be carried, transported, or stored.

Figure 3:
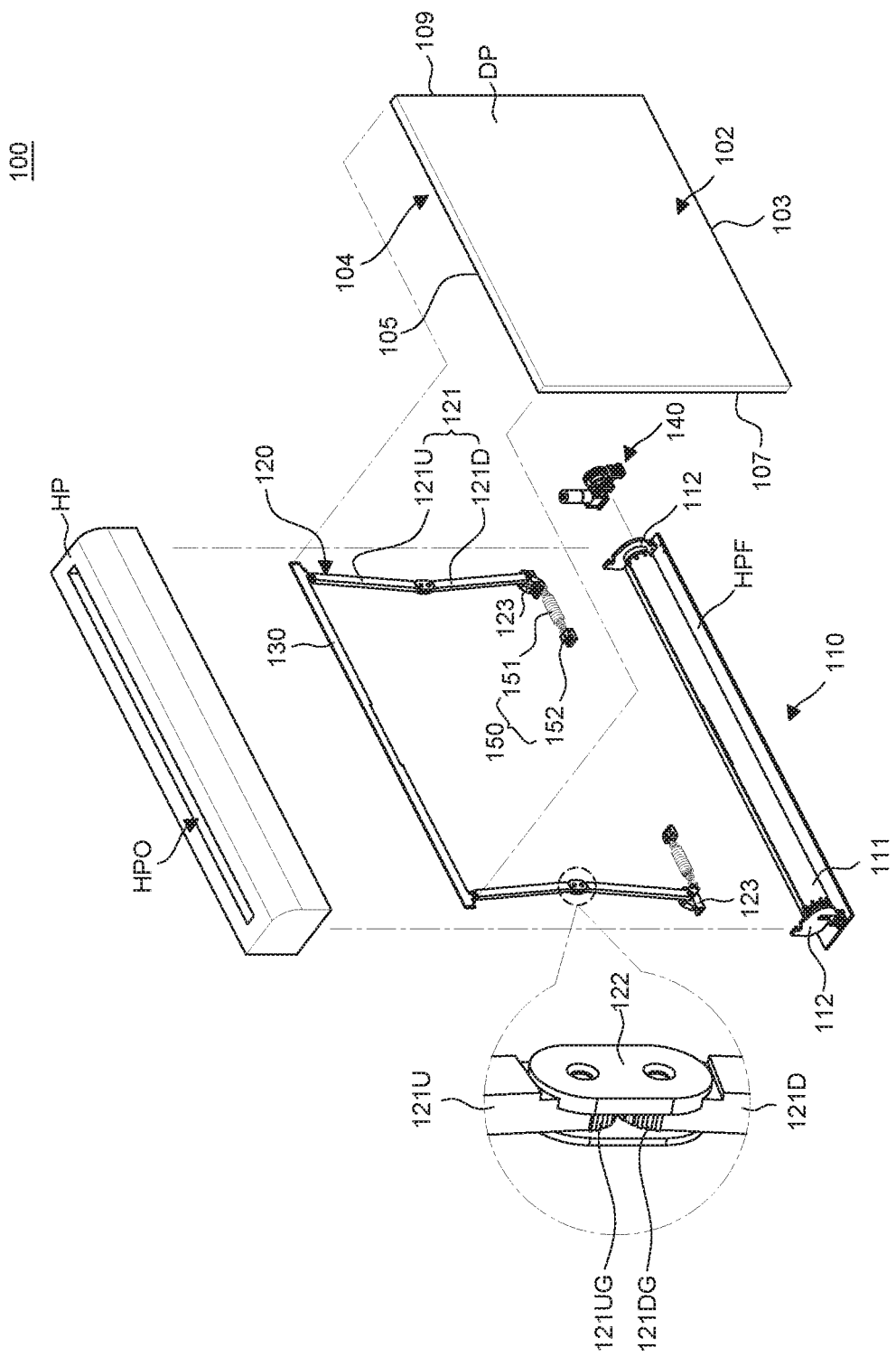
FIG. 3 is an exploded perspective view of the display device of FIG. 1 according to the present disclosure.
Figure 4:
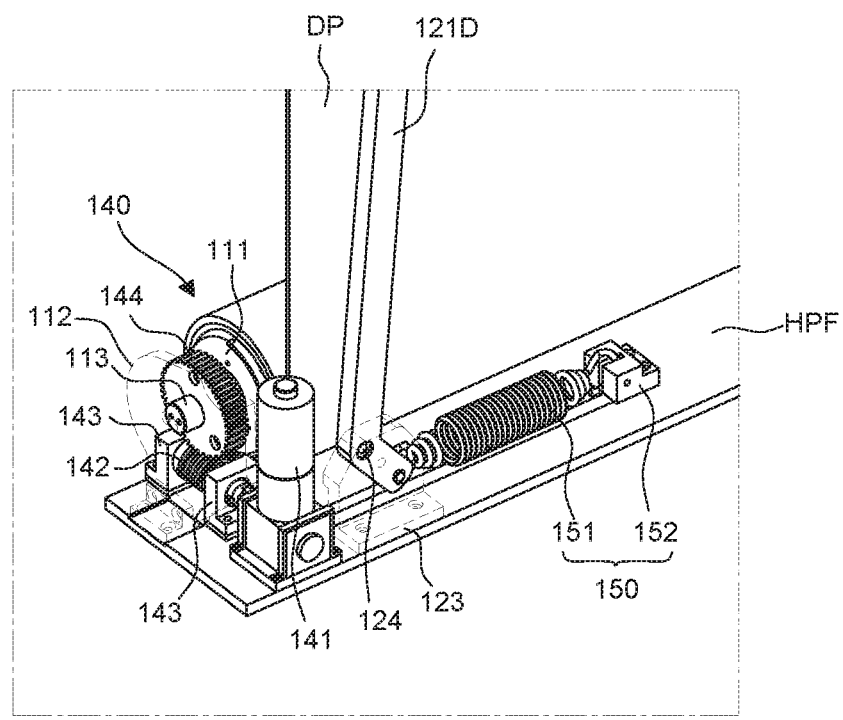
FIG. 4 is an enlarged perspective view of a portion of the display device of FIG. 1 according to the present disclosure.

FIGS. 3 and 4 provide further details of embodiments of driving mechanisms and components for manipulating the display panel DP between the fully rolled configuration and the fully unrolled configuration. For example, FIGS. 3 and 4 describe a roller unit 110 and a driving assembly 140 (which may be referred to hereinafter as a driving unit 140) for rolling and unrolling the display panel DP, which are both disposed or received in the housing unit HP. A lifting assembly 150 (which may be hereinafter referred to as a lifting unit) which lifts the display panel DP is also disposed or received in the housing unit HP. A link unit 120 which connects the display panel DP and the lifting unit 150 is on a rear surface 104 of the display panel DP.

Hereinafter, the roller unit 110, the link unit 120, a head bar 130, the driving unit 140, and the lifting unit 150 will be described in detail with reference to FIGS. 3 and 4.

FIG. 3 is an exploded perspective view of the display device 100. FIG. 4 is an enlarged perspective view of a portion of the display device 100. Specifically, FIG. 4 is an enlarged view of the driving unit 140 and the lifting unit 150 on the rear surface 104 of the display device 100 in order to explain a connection relationship of the link unit 120 and the lifting unit 150 of the display device 100 and a connection relationship of the roller unit 110 and the driving unit 140. In FIG. 4, for the convenience of description, a roller support unit 112 and a link support unit 123 are illustrated with a dotted line to avoid obscuring features that are normally located behind the roller support unit 112 and the link support unit 123 in the orientation shown in FIG. 4.

Referring to FIGS. 3 and 4, the display device 100 according includes the display panel DP, which includes a front or display surface 102 opposite the rear surface, the housing unit HP, the roller unit 110, the link unit 120, the head bar 130, the driving unit 140, and the lifting unit 150. In one embodiment, the front surface 102 of the display panel DP is referred to as a first surface of the display panel DP and the rear surface 104 is referred to as a second surface of the display panel DP.

The roller unit 110 rotates in a clockwise direction or a counterclockwise direction to roll or unroll the display panel DP, respectively. In one embodiment, rotation of the roller unit 110 in the clockwise direction manipulates the display panel DP from the unrolled configuration to the rolled configuration, while in other embodiments, rotation of the roller unit 110 in the counterclockwise direction manipulates the display panel DP from the rolled configuration to the unrolled configuration. The roller unit 110 includes a roller 111, a roller support unit 112, and a roller shaft 113, which is received in a longitudinal bore of the roller 111. In other words, the roller shaft 113 is positioned in the roller 111 and extends beyond outer edges of the roller 111 to couple to the roller support unit 112.

The roller 111 is a member around which the display panel DP is wound or rolled. The roller 111 rotates in a clockwise direction or a counterclockwise direction to roll or unroll, respectively, or vice versa, the display panel DP, which is fixedly coupled to the roller 111. The roller 111 may be, for example, formed to have a cylindrical shape. However, other shapes are specifically contemplated in embodiments of the present disclosure, such as triangular, ovular, square, or rectangular, among other geometric shapes. In embodiments where the roller 111 has edges, such as if the roller 111 is square, it is preferable that such edges are rounded to avoid damage to the display panel DP.

As noted above, the display panel DP is fixed to the roller 111. For example, a lower edge 103 of the display panel DP may be fixed to the roller 111. In an embodiment, the lower edge 103 is a first edge or simply, an edge of the display panel DP. When the roller 111 rotates in a clockwise direction, the display panel DP is wound around the roller 111. When the roller 111 rotates in a counterclockwise direction, the display panel DP, which is wound around the roller 111, is unwound from the roller 111. However, the winding and unwinding of the display panel DP in accordance with the rotating direction of the roller 111 may vary depending on an arrangement or relationship of the roller 111 and the display panel DP. For example, the winding and unwinding may depend on whether a surface of the display panel DP which is in contact with an outer circumferential surface of the roller 111 is the front surface 102 of the display panel DP or the rear surface 104 of the display panel DP. It is to be appreciated that rotation of the roller 111 to wind or unwind the display panel DP according to the rotation can be selected.

The roller support unit 112 preferably includes two support units 112, one disposed at end of the roller 111. The roller 111 is rotatably coupled to the roller support unit 112. Specifically, the roller shaft 113 protruding from both ends of the roller 111 is rotatably coupled to the roller support unit 112. The roller support unit 112 is disposed on a bottom surface HPF of the housing unit HP, as in FIG. 4. A side upper end of the roller support unit 112 is coupled to the roller shaft 113 protruding from both ends of the roller 111. Therefore, the roller support units 112 may support the roller 111 in spaced relationship relative to the bottom surface HPF of the housing unit HP. Therefore, when the roller 111 rotates, the roller 111 and the display panel DP wound to, and rolled about, the roller 111 do not interfere with, or contact, the bottom surface HPF of the housing unit HP, even when the display panel DP is in the fully rolled configuration.

The link unit 120 supports the display panel DP. Specifically, the link unit 120 supports the display panel DP in the unrolled configuration from the roller 111 in a flat and planar orientation. Preferably, the link unit 120 supports the display panel DP in a vertical orientation relative to the housing unit HP. The link unit 120 includes a plurality of links 121 coupled to each other, a link connecting unit 122 coupled between pairs of links 121, a link support unit 123 coupled to one of the plurality of links, and a support shaft 124 coupled to one of the plurality of links.

Each of the plurality of links 121 is connected to an upper side of the display panel DP. For example, one end of each of the plurality of links 121 is connected to both sides of an upper edge 105 of the display panel DP to support the display panel DP in a flat and planar orientation when the display panel DP is in the unrolled configuration.

Each of the plurality of links 121 includes an upper link 121U and a lower link 121D. The upper link 121U may be referred to as a first link and the lower link 121D may be referred to as a second link. The upper link 121U and the lower link 121D are rotatably coupled to each other to be folded or unfolded. That is, the upper link 121U and the lower link 121D rotate in a direction to be proximate each other when in a folded configuration. The upper link 121U and the lower link 121D rotate in a direction away from each other when manipulated from the folder configuration to an unfolded configuration.

One end of the upper link 121U is rotatably coupled to both ends of the upper edge 105 of the display panel DP. Specifically, one end of the upper link 121U is rotatably coupled to the head bar 130, which is fixed to the upper edge 105 of the display panel DP.

The head bar 130 is a member for connecting the display panel DP and the upper link 121U. In one embodiment, the head bar 130 is fixed to the upper edge 105 of the display panel DP. The upper link 121U may be rotatably coupled to the head bar 130 and the head bar 130 may move in a vertical direction in accordance with the rotation of the upper link 121U. Because the display panel DP is preferably fixed to the head bar 130, the display panel DP may also move in a vertical direction together with the head bar 130.

The other end of the upper link 121U is rotatably coupled to one end of the lower link 121D. A gear 121UG may be further disposed at the other end of the upper link 121U so that the other end of the upper link 121U is rotatably coupled to one end of the lower link 121D. For example, the gear 121UG disposed at the other end of the upper link 121U may have a shape of a spur gear, but is not limited thereto. The gear 121UG includes a plurality of teeth, splines, ribs, or like structures, such that the gear 121UG can be mechanically coupled or intermeshed a gear 121DG, as described herein.

One end of the lower link 121D is rotatably coupled to the other end of the upper link 121U. Similar to the other end of the upper link 121U, the gear 121DG may be further disposed at one end of the lower link 121D. Further, similar to the gear 121UG disposed at the other end of the upper link 121U, the gear 121DG disposed at one end of the lower link 121D may be formed to have a shape of a spur gear, but is not limited thereto. In other words, the gear 121DG includes a plurality of teeth, splines, ribs, or like structures such that the gear 121DG is mechanically coupled to the gear 121UG in an intermeshed configuration.

The link connecting unit 122 is disposed at the other end of the upper link 121U and one end of the lower link 121D. A shaft of the gear 121UG at the other end of the upper link 121U and a shaft of the gear 121DG at one end of the lower link 121D are connected to the link connecting unit 122. Therefore, the gear 121UG at the other end of the upper link 121U rotates around the shaft connected to the link connecting unit 122. The gear 121DG at one end of the lower link 121D rotates around the shaft connected to the link connecting unit 122. Teeth of the gear 121UG at the other end of the upper link 121U and teeth of the gear 121DG at one end of the lower link 121D are engaged with each other so that the upper link 121U also rotates in accordance with the rotation of the lower link 121D and the lower link 121D also rotates in accordance with the rotation of the upper link 121U.

The other end of the lower link 121D is coupled to the lifting unit 150. Specifically, since the other end of the lower link 121D is coupled to the lifting unit 150, the other end of the lower link 121D may rotate via the lifting unit 150, as described herein.

The lower link 121D is rotatably coupled to the support shaft 124 of the link support unit 123 at a point between one end and the other end of the lower link 121D. Therefore, the lower link 121D may rotate relative to the support shaft 124 via torque or force generated by the lifting unit 150. Specifically, the lifting unit 150 rotates the other end of the lower link 121D around the support shaft 124 to lift the lower link 121D, which will be described below in detail with reference to FIGS. 6A and 6B.

The support shaft 124 protrudes near an upper end of one surface of the link support unit 123. The support shaft 124 is in spaced relationship with the bottom surface HPF of the housing unit HP. When the other end of the lower link 121D rotates by the lifting unit 150, the support shaft 124 is spaced apart from the bottom surface HPF of the housing unit HP so that the other end of the lower link 121D and the bottom surface HPF of the housing unit HP do not interfere with each other.

In one embodiment, the plurality of links 121 includes two links 121. Each of the links 121 includes the upper link 121U, which may be referred to as a first link, and the lower link 121D, which may be referred to as a second link. The upper link 121U includes opposing first and second ends, wherein the first end is coupled to the head bar 130 and the second end is rotatably coupled to the lower link 121D, as shown in FIG. 3. The lower link 121D similarly includes opposing first and second ends, wherein the first end is coupled to the upper link 121U and the second end is coupled to the lifting unit 150 and the elastic member 151 via the link support unit 123. The head bar 130, and thus the upper link 121U is attached to the upper edge 105 of the display panel PD and the lower link 121D is coupled to the lifting unit 150 proximate the lower edge 103 of the display panel PD. As shown in FIG. 3, the second end of the upper link 121U and the first end of the lower link 121D include gears 121UG, 121DG, respectively, which are mechanically coupled to each other in an intermeshed or interlocked configuration via the link connecting unit 122. In other words, the link connecting unit 122 is coupled to each of the links 121U, 121D to secure the links 121U, 121D in a relationship wherein the links 121U, 121D can rotate relative to each other.

When the display panel DP is manipulated from the rolled configuration to the unrolled configuration, the lifting unit 150 acts with a force on the second end of the lower link 121D to pull the second end of the lower link 121D towards a center of the display panel DP, which causes rotation of the first and second links 121U, 121D towards vertical alignment in an unfolded configuration. Further, when the display panel DP is manipulated from the rolled configuration to the unrolled configuration, the lifting unit 150 acts with a similar force to maintain the links 121U, 121D in the unfolded configuration, which is opposite to the force provided by the driving unit 140 to manipulate the display panel DP to the rolled configuration. As such, when the display panel DP is in any configuration (e.g. rolled, unrolled, or anywhere in between), the lifting unit 150 and the links 121 provide a force that tends to keep the display panel DP in a flat and planar orientation that is preferably vertical relative to the bottom surface HPF of the housing unit HP.

Referring to FIG. 4, the lifting unit 150 is connected to the plurality of links 121 to apply a force or a torque to the plurality of links 121 to be lifted. The lifting unit 150 includes an elastic member 151 and an elastic member fixing unit 152.

The elastic member 151 of the lifting unit 150 is disposed at the outside of the roller 111 to be connected to the plurality of links 121. The elastic member 151 is a member having an elastic force and is connected to the plurality of links 121 to transfer the elastic force to the plurality of links 121 to lift the links 121. In other words, the elastic member 151 applies the elastic force to the plurality of links 121 to unfold the links 121 so that the lower link 121D rotates in a direction in which the lower link 121D is disposed to be vertical relative to the lower edge 103 and the upper edge 105 of the display panel DP. The elastic member 151 may be, for example, a spring. However, as long as a member applies a force to the lower link 121D to rotate the other end of the lower link 121D, the elastic member is not limited to a spring, but rather, may be another type of elastic material or device with elastic properties.

The elastic member 151 is positioned closer to a center area of the display panel DP than the other end of the lower link 121D. That is, the elastic member 151 may be disposed between the other end of the lower link 121D of the link 121 disposed to be adjacent to one side 107 of the display panel DP and the other end of the lower link 121D of the link 121 disposed to be adjacent to the other side 109 of the display panel DP.

As described above, one end of the elastic member 151 is connected to the other end of the lower link 121D. Specifically, one end of the elastic member 151 may be rotatably coupled to the other end of the lower link 121D. For example, one end of the elastic member 151 is inserted into a hole 121DH formed in and extending through the other end of the lower link 121D so that the other end of the lower link 121D may rotate by the elastic force of the elastic member 151.

The other end of the elastic member 151 is connected to the elastic member fixing unit 152. Specifically, the elastic member fixing unit 152 is fixedly coupled to the bottom surface HPF of the housing unit HP and the other end of the elastic member 151 may be connected to the elastic member fixing unit 152. The elastic member 151 may be contracted or expanded with respect to the elastic member fixing unit 152. In other words, the elastic member 151 translates along its axis while the elastic member fixing unit 152 remains fixed in location. The other end of the lower link 121D connected to one end of the elastic member 151 also rotates in accordance with contraction and expansion of the elastic member 151. The elastic member 151 may be contracted or expanded by the rotation of the other end of the lower link 121D. It is to be appreciated that the length, and other properties, of the elastic member 151 may be selected according to the preferred elastic force to be generated by the elastic member 151.

The driving unit 140 is disposed proximate the roller 111 to rotate the roller 111. In one embodiment, the driving unit 140 is adjacent to at least one of the ends of the roller 111 and is connected to the roller 111. The driving unit 140 may rotate the roller 111 in a clockwise direction or a counterclockwise direction and the display panel DP may be wound or unwound around the rotating roller 111 accordingly, as described herein.

The driving unit 140 may generate a torque sufficient to rotate the roller 111 about its axis. Because the driving unit 140 is coupled mechanically and physically to the roller 111, as described herein, the generated torque is applied to the roller 111 to rotate the roller 111. The driving unit 140 includes a motor 141, a worm gear 142, a worm gear support unit 143, and a worm wheel 144.

The motor 141 applies a torque to the roller 111 to rotate the roller 111. The motor 141 applies the torque to the roller 111 to rotate the roller 111 in a clockwise direction or applies the torque to the roller 111 to rotate the roller 111 in a counterclockwise direction, which can be selected according to applications of the motor 141 and the display device 100. In this embodiment, the motor 141 is arranged vertically with respect to the bottom surface HPF of the housing unit HP.

In order to transmit the torque from the motor 141 to the roller 111, the worm gear 142 and the worm wheel 144 are disposed between the motor 141 and the roller 111 and mechanically coupled to each other. The worm gear 142 and the worm wheel 144 are transmission members which transmit the torque generated in the motor 141 to the roller 111 and rotate the roller 111 in a clockwise direction or a counterclockwise direction via the torque supplied by the motor 141.

Saw teeth are formed on outer circumferential surfaces of each of the worm gear 142 and the worm wheel 144. The worm gear 142 and the worm wheel 144 are disposed such that the saw teeth of the worm gear 142 and the saw teeth of the worm wheel 144 are engaged with each other in an intermeshed or interconnected mechanical relationship. The worm gear 142 may rotate around a shaft of the worm gear 142 in a clockwise direction or a counterclockwise direction by the torque generated from the motor 141. The worm wheel 144, whose saw teeth are engaged with the saw teeth of the worm gear 142, accordingly rotates around a shaft of the worm wheel 144 in a clockwise direction or a counterclockwise direction.

The worm gear support unit 143 is arranged on both ends of the worm gear 142. The worm gear 142 is coupled to the worm gear support unit 143 to enable rotation of both ends of the worm gear 142. The worm gear 142 is arranged or positioned at a lower portion of the worm wheel 144 to transmit the torque from the motor 141 to the worm wheel 144. In one embodiment, the worm gear 142 may be supported by the worm gear support unit 143 in spaced relationship relative to the bottom surface HPF of the housing unit HP. Therefore, when the worm gear 142 rotates by the torque from the motor 141, the worm gear 142 does not interfere with the bottom surface HPF of the housing unit HP.

The worm wheel 144 is fixedly coupled to the roller shaft 113. For example, the worm wheel 144 and the roller shaft 113 may be integrally formed or the worm wheel 144 and the roller shaft 113 may be separately formed, and fixed together. Therefore, the roller 111 also rotates in a clockwise direction or a counterclockwise direction in accordance with the rotation of the worm wheel 144.

Although it is described in FIG. 4 that the driving unit 140 includes the motor 141, the worm gear 142, the worm gear support unit 143, and the worm wheel 144, configurations of the driving unit 140 are not limited thereto. Rather, other configurations are specifically contemplated that include the driving unit 140 rotating the roller 111 in the clockwise direction or the counterclockwise direction. For example, in order to transmit the torque of the motor 141 to the roller 111, instead of the worm gear 142 and the worm wheel 144, a member such as a chain or a belt may be used, or a geared motor may be directly connected to the roller 111.

Although FIG. 4 illustrates that the driving unit 140 is disposed at any one of the ends of the roller 111, the driving unit 140 may be disposed on both ends of the roller 111 to rotate the roller 111, and is therefore not limited thereto to the arrangement shown in FIGS. 3 and 4.

Accordingly, the display panel DP may be wound around the roller 111, which rotates by the driving unit 140.

The display panel DP may be unwound by the roller 111 via the driving unit 140 and the plurality of links 121, which are unfolded by the elastic member 151. In this case, the elastic member 151 unfolds the plurality of links 121 to support the display panel DP such that the display panel DP is maintained in a flat, planar, and preferably vertical orientation relative to the housing unit HP via the plurality of links 121.

Hereinafter, a driving operation for manipulating the display panel DP from the fully rolled configuration to the unrolled configuration will be described in detail with reference to FIGS. 5 to 6B.

Figure 5:
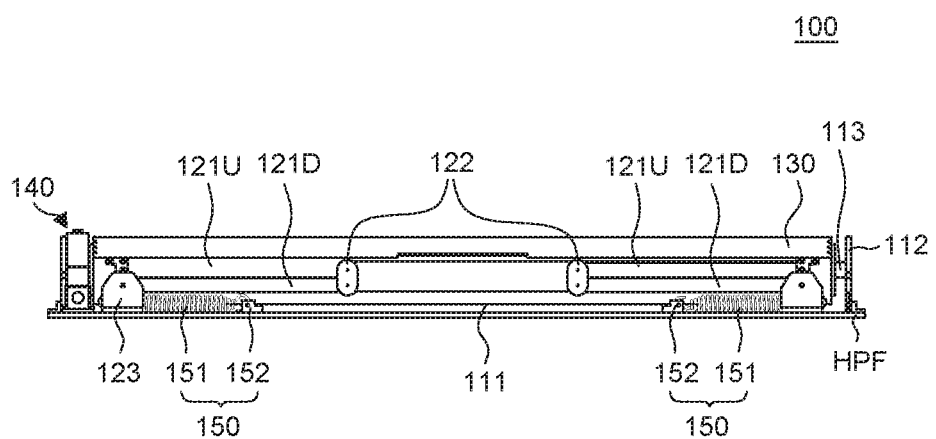
FIG. 5 is a rear view of the display device of FIG. 1 in a fully rolled configuration according to the present disclosure.
Figure 6A:
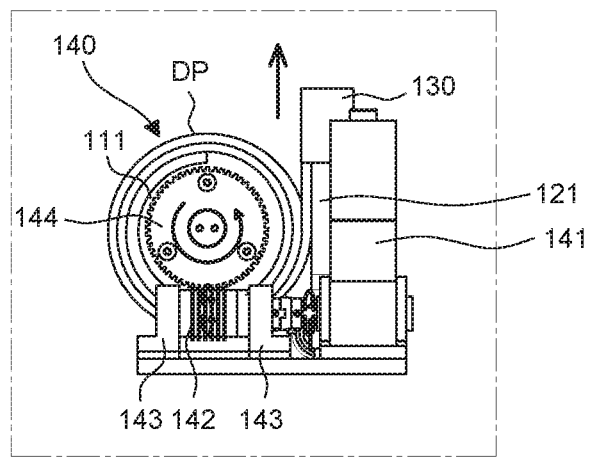
FIGS. 6A and 6B are schematic views for explaining operation of a driving assembly and an elastic member of the display device of FIG. 1 for manipulating the display device between the rolled and unrolled configurations.

FIG. 5 is a rear view of a display device 100, and more specifically, the display panel DP, in the fully rolled configuration. FIGS. 6A and 6B are schematic views for explaining operation of the driving unit 140 and the elastic member 151 for manipulating the display unit DP. Specifically, FIG. 6A is an enlarged side view of a portion of the display device 100 illustrating the motor and the roller 111 in more detail. FIG. 6B is an enlarged rear view of the display device 100 illustrating the elastic member 151 in more detail. In FIGS. 5 to 6B, the bottom surface HPF of the housing unit HP is illustrated in order to more clearly describe the roller unit 110, the driving unit 140, and the lifting unit 150 disposed in the housing unit HP.

Referring to FIG. 5, the display panel DP is in the fully rolled configuration, wherein the display panel DP is fully wound around the roller 111.

In the fully rolled configuration, the plurality of links 121 are folded such that the upper link 121U and the lower link 121D overlap each other. Specifically, one pair of the upper links 121U and the lower link 121Ds of the plurality of links 121, which are proximate or adjacent to one side 107 of the display panel DP, are folded to overlap each other. The upper link 121U and the lower link 121D of a second pair of links of the plurality of links 121, which are adjacent to the other side 109 of the display panel DP are folded to overlap each other.

Further, the plurality of links 121 are disposed to be horizontal to the upper edge 105 and the lower edge 103 of the display panel DP. In the plurality of links 121, the other end of the lower link 121D may be disposed to be farther from the center area of the display panel DP than one end of the lower link 121D. In the plurality of links 121, the other end of the upper link 121U may be disposed to be closer to the center area of the display panel DP than one end of the upper link 121U.

In one embodiment, even though the force of the lifting unit 150 is applied to the plurality of links 121 in a fully wound state, which force acts to lift the plurality of links 121, the plurality of links 121 may maintain a folded state via the driving unit 140. In other words, in the fully wound state or the fully rolled configuration, the driving unit 140 fixes the roller 111 so that the display panel DP is preventing from unrolling. As such, the plurality of links 121 will similarly be maintained in the folded state. The display panel DP will also remain in the fully rolled configuration around the roller 111 via the driving unit 140, which is locked in place. The plurality of links 121 connected to the head bar 130 at the upper edge of the display panel DP also remain in the folded state without being lifted. Therefore, the driving unit 140 may maintain the fixed state of the roller 111 so as not to rotate the roller 111, such that the display panel DP maintains the fully rolled or wound configuration around the roller 111 and the plurality of links 121 connected to the head bar 130 also remain in the folded state.

Hereinafter, a driving operation of the driving unit 140 and the lifting unit 150 to manipulate the display panel DP from the fully rolled configuration around the roller 111 to the unrolled configuration will be described with reference to FIGS. 6A and 6B.

Referring to FIG. 6A, the driving unit 140 rotates the roller 111 in a counterclockwise direction. Specifically, the motor 141 rotates the worm gear 142 in a clockwise direction or a counterclockwise direction in accordance with an engagement state of saw teeth of the worm gear 142 and the worm wheel 144. The worm wheel 144, whose saw teeth are engaged with the saw teeth of the worm gear 142, rotates in a counterclockwise direction in accordance with the rotation of the worm gear 142. Therefore, the driving unit 140 rotates the roller 111 in a counterclockwise direction to unwind the display panel DP, which is illustrated wound around the roller 111, from the roller 111. Put another way, during operation, operation of the driving unit 140 rotates the roller 111, which manipulates the display panel DP from the fully folded or wound configuration to the unfolded configuration.

Figure 6B:
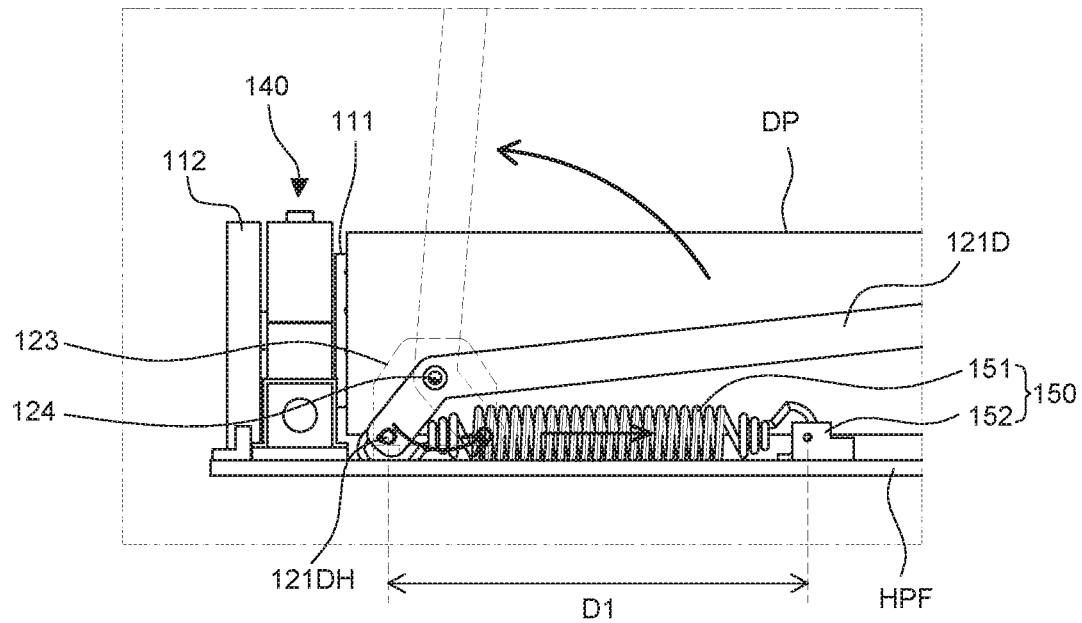

Referring to FIG. 6B, the display panel DP is unwound from the roller 111 by the driving unit 140 and the elastic member 151 of the lifting unit 150, which applies an elastic force to the plurality of links 121 so as to lift the links 121.

First, in the fully rolled configuration, the driving unit 140 fixes the roller 111 so as to prevent the roller 111 from rotating, as above. By preventing rotation of the roller 111 via the driving unit 140, the plurality of links 121 are also maintained in the folded state.

When the display panel DP is to be unwound from the roller 111, the driving unit 140 releases, such that the driving unit 140 may rotate the roller 111. The release of the force from the driving unit 140 which maintains the plurality of links 121 in the folded state enables the plurality of links 121 to be unfolded from the folded state by the elastic member 151.

In one embodiment, a length from one end of the elastic member 151 to the other end is a first length D1 when the display panel DP is in the fully rolled configuration. Specifically, in the fully rolled configuration, the elastic member 151 may be expanded to a maximum amount of expansion without damaging the elastic member 151. Therefore, in this embodiment, the first length D1 is a maximum length of the elastic member 151.

The other end of the elastic member 151 is fixed to the elastic member fixing unit 152 and one end of the elastic member 151 may move in accordance with the rotation of the lower link 121D. In this case, as described above, in the fully rolled configuration of the display panel DP, the driving unit 140 may fix the roller 111 so as prevent rotation of the roller and the plurality of links 121 connected to the head bar 130 display panel. In other words, fixing the driving unit 140 prevents movement of the links 121 and the head bar 130, which prevents the display panel DP from unrolling. In this case, the other end of the lower link 121D is disposed farthest from the center area of the display panel DP as compared with other parts. One end of the elastic member 151 connected to the other end of the lower link 121D also moves away from the center area of the display panel DP. Therefore, the elastic member 151 is expanded. Until the driving unit 140 releases the fixing force on the roller 111, the elastic member 151 maintains the maximum expansion state due to the force of the driving unit 140, wherein the elastic member 151 has the maximum first length D1.

When the driving unit 140 releases the fixing force on the roller 111 (e.g. when the driving unit 140 is an operational state) and rotates the roller 111 to unwind the display panel DP, the fixing force from the driving unit 140 on the elastic member 151 is also released, such that the elastic member 151 contracts from the maximum first length D1 to its original state. Therefore, one end of the elastic member 151 may move toward the elastic member fixing unit 152 with respect to the other end of the elastic member 151 and the elastic member fixing unit 152. In other words, one end of the elastic member 151 may move to be closer to the center area of the display panel DP relative to its position in the maximum first length D1.

Therefore, as the display panel DP is unrolled, the elastic member 151 may rotate the other end of the lower link 121D of the plurality of links 121 so that the plurality of folded links 121 unfolds. That is, the elastic member 151 may rotate the other end of the lower link 121D to lift the plurality of links 121 by the elastic force of the elastic member 151 from its maximum expanded state to its original or resting state.

The other end of the lower link 121D rotates so as to be closer to the center area of the display panel DP by the elastic member 151. The lower link 121D rotates with respect to the support shaft 124 by the rotation of the other end of the lower link 121D. For example, the lower link 121D rotates in a direction that is vertical to the bottom surface HPF of the housing unit HP.

Therefore, when the display panel DP is to be unrolled, the driving unit 140 rotates the roller 111 to initiate unrolling of the display panel DP from the roller 111 and the force of the driving unit 140 applied to the elastic member 151 is released. Therefore, the elastic member 151 may be contracted. As the elastic member 151 is contracted, one end of the elastic member 151 may move closer to the center area of the display panel DP and the other end of the lower link 121D connected to one end of the elastic member 151 also rotates to be closer to the center area of the display panel DP. As a result, the lower link 121D and the upper link 121U connected to the lower link 121D are lifted, which raises the display panel DP.

Hereinafter, a driving operation corresponding to manipulating the display panel DP from the fully unrolled configuration to the fully rolled configuration will be described in detail with reference to FIGS. 7 to 8B.

Figure 7:
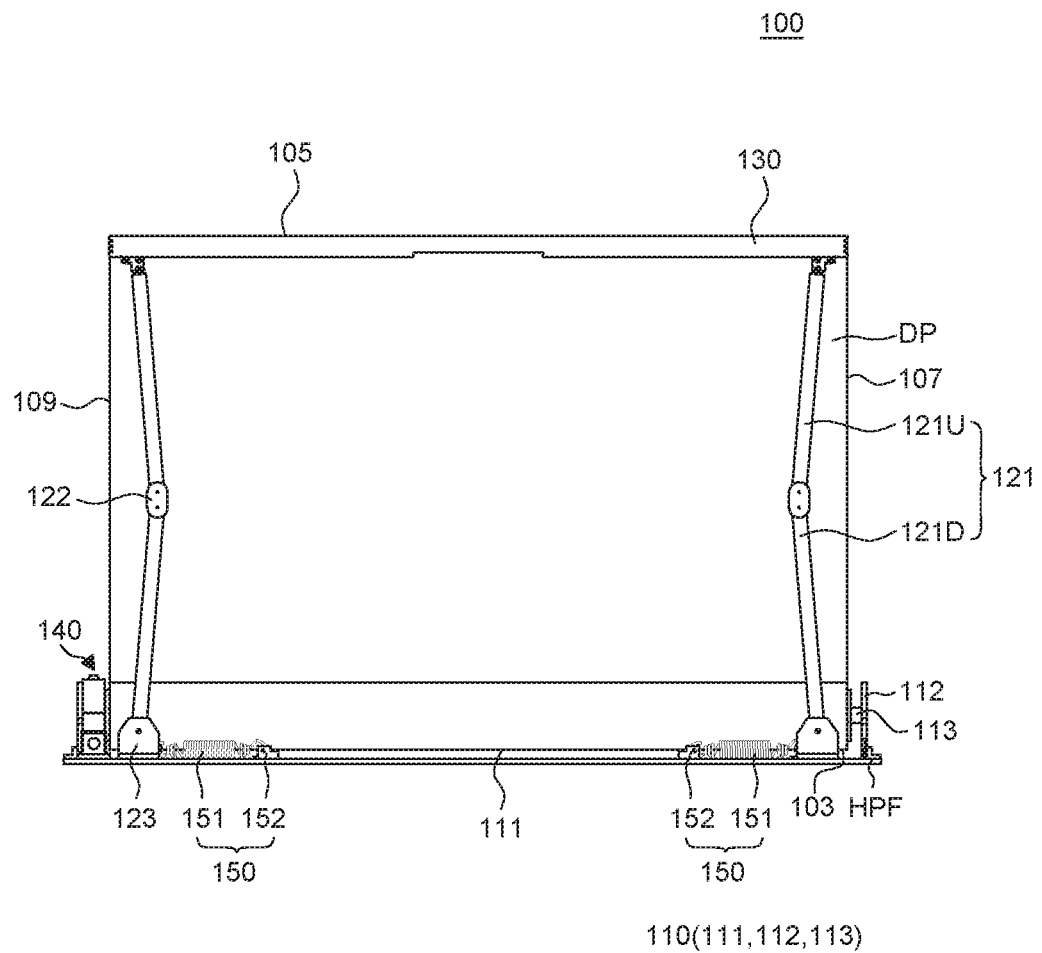
FIG. 7 is a rear view of the display device of FIG. 1 in a fully unrolled configuration according to the present disclosure.
Figure 8A:
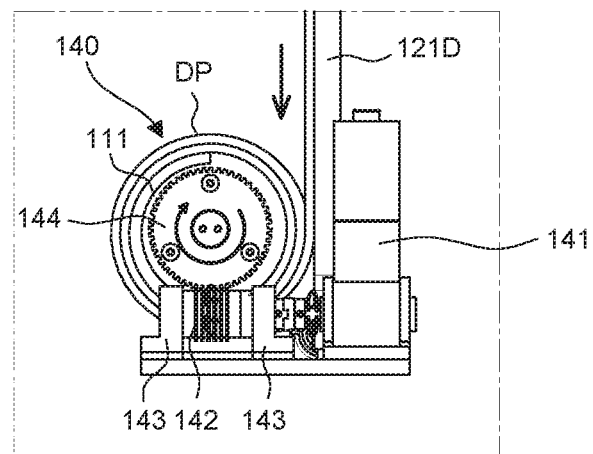
FIGS. 8A and 8B are schematic views for explaining the driving assembly and the elastic member of the display device of FIG. 1 for manipulating the display device between the unrolled and rolled configurations.

FIG. 7 is a rear view of the display device 100 in a fully unrolled configuration. FIGS. 8A and 8B are schematic views for explaining operation of the driving unit 140 and the elastic member 151 when the display device 100 is wound or rolled from the unrolled configuration to the rolled configuration. Specifically, FIG. 8A is an enlarged side view of a portion of the display device 100 illustrating the driving unit in more detail. FIG. 8B is an enlarged rear view of a portion of the display device 100 illustrating the elastic member 151 in more detail. In FIGS. 8A to 8B, only the bottom surface HPF or a bottom portion of the housing unit HP is illustrated in order to clearly describe the roller unit 110, the driving unit 140, and the lifting unit 150 disposed proximate the bottom surface HPF in the housing unit HP.

Referring to FIG. 7, the display panel DP is in the fully unrolled configuration, where in the display panel DP is fully unwound from the roller 111.

In the fully unrolled configuration, the upper link 121U and the lower link 121D of each of the plurality of links are fully unfolded. Specifically, the upper link 121U and the lower link 121D of the link 121 which is adjacent to one side 107 of the display unit DP are unfolded as close as possible to vertical (e.g. the links 121U, 121D are aligned in a straight line). The upper link 121U and the lower link 121D of the link 121 which is adjacent to the other side 109 of the display panel DP are similarly unfolded as close as possible to vertical (e.g. the links 121U, 121D are aligned in a straight line). For example, the upper link 121U and the lower link 121D are unfolded to a maximum rotation, in which an angle between the upper link 121U and the lower link 121D is an obtuse angle which is larger than 90 degrees and smaller than 180 degrees. In other embodiments, the angle is 180 degrees, or greater than 180 degrees. As such, the present disclosure is not limited by the angle between the links 121U, 121D.

The plurality of links 121 are disposed to be vertical relative to the upper edge 105 and the lower edge 103 of the display panel DP. In each of the plurality of links 121, the other end of the lower link 121D may be disposed to be closer to the lower edge 103 of the display panel DP, the roller 111, and the bottom surface HPF of the housing unit HP than one end of the lower link 121D. In each of the plurality of links 121, the other end of the upper link 121U may be disposed to be closer to the lower edge 103 of the display panel DP, the roller 111, and the bottom surface HPF of the housing unit HP than one end of the upper link 121U.

The plurality of links 121 are maintained in the unfolded state by the driving unit 140 and the lifting unit 150. In the fully unrolled configuration of the display panel DP, the driving unit 140 applies a force to fix the roller 111 so that the roller 111 cannot be rotated, and as such, the display panel DP is not wound around the roller 111. That is, the display panel DP is maintained in the fully unrolled configuration by the driving unit 140. The plurality of links 121 connected to the head bar 130 at the upper edge 105 of the display panel DP remain in the unfolded state due to the fixing force applied to the roller 111, which prevents the lifting unit 150 from lowering the links 121 and the head bar 130. In this case, the lifting unit 150 continuously applies a force to unfold the plurality of links 121 regardless of the winding or unwinding of the display panel DP due to the force exerted by the elastic member 151. Therefore, the lifting unit 150 applies the force to the plurality of links 121 such that the plurality of links 121 remain unfolded via the lifting unit 150. Therefore, the head bar 130 and the display panel DP connected to the plurality of links 121 may remain in the unrolled configuration by the lifting unit 150 and the driving unit 140.

Further, when manipulating the display panel DP from the fully rolled configuration to the fully unrolled configuration or vice versa, the plurality of links 121 may remain unfolded all the time to support a part of the display panel DP which is not wound around the roller 111 in a flat and planar orientation. In other words, regardless of the configuration of the display panel DP (e.g. rolled or unrolled), a portion of the display panel DP may remain unrolled, in which case, the plurality of links 121 and the lifting unit 150 support the portion of the display panel DP in the unrolled configuration.

In the embodiment shown in FIG. 8A, the driving unit 140 rotates the roller 111 in a clockwise direction. Specifically, the motor 141 rotates the worm gear 142 in the counter-clockwise direction or the clockwise direction and the worm wheel 144 rotates in the clockwise or counterclockwise direction in accordance with the rotation of the worm gear 142. Therefore, the driving unit 140 rotates the roller 111 in a clockwise direction to wind the display panel DP around the roller 111. In other words, the driving unit 140 rotates the roller 111 to which the display panel DP is fixed, which manipulates the display panel DP from the unrolled configuration to the rolled configuration.

Figure 8B:
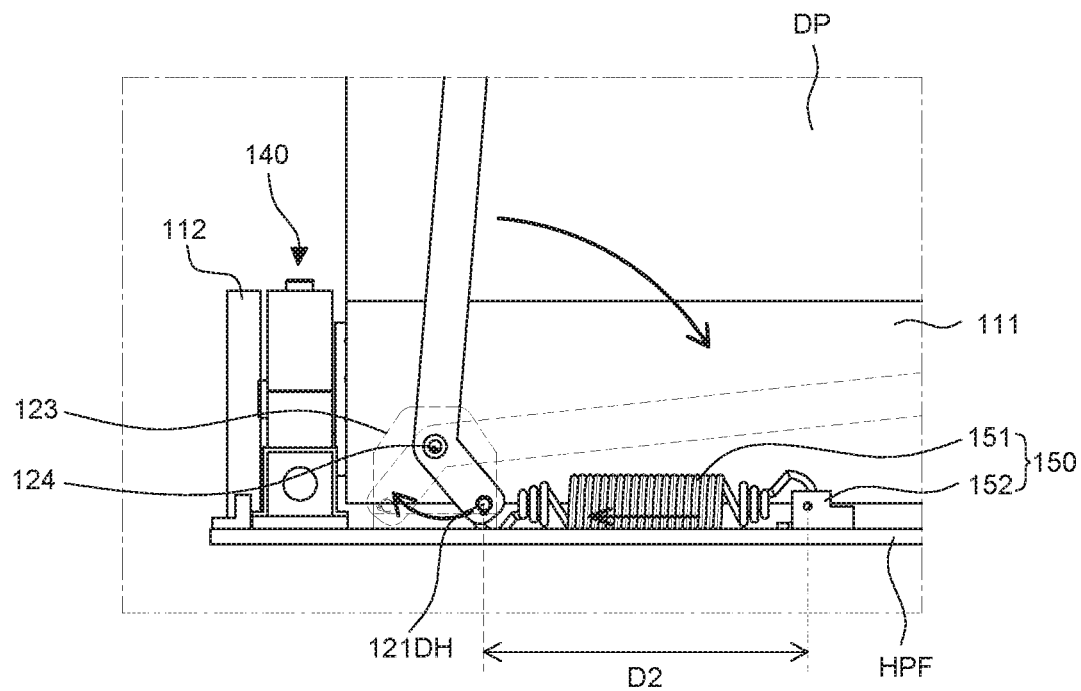

Referring to FIG. 8B, the display panel DP is wound around the roller 111 by the driving unit 140 via rotation of the roller 111 by the driving unit 140. However, when the display panel DP is wound around the roller 111 by the driving unit 140, the elastic member 151 of the lifting unit 150 applies an elastic force to the plurality of links 121 so as to lift the plurality of links. In one embodiment, the force applied by the driving unit 140 is greater than the force applied to the links 121 by the lifting unit 150, and as such, the driving unit 140 causes the display panel DP to be wound around the roller 111 while also folding the links 121 and expanding the elastic member 151, as described herein. However, more preferably, the force applied by the driving unit 140 is less than the force applied to the links 121 by the lifting unit 150, but because of the arrangement of the links 121 and the support shaft 124, greater torque is generated by the driving unit 140 as compared to the lifting unit 150, as described herein.

First, in the fully unrolled configuration, the driving unit 140 fixes the roller 111 so as to prevent the roller 111 from rotating and the lifting unit 150 applies a force to the plurality of links 121 so as maintain the links 121 in the unfolded state. When the display panel DP is wound around the roller 111, the driving unit 140 rotates the roller 111 and the lifting unit 150 applies a force to the plurality of links 121 to maintain the links 121 in the unfolded state. Because the torque generated by the driving unit 140 is greater than the torque applied by the lifting unit 150, the plurality of links 121 are folded by the force of the driving unit 140 despite the contrary force provided by the lifting unit 150.

In this embodiment, the force of the driving unit 140 is less than the force of the lifting unit 150. Specifically, the motor 141 of the driving unit 140 winds the display panel DP around the roller 111 to lower the display panel DP to the rolled configuration. The upper link 121U connected to the head bar 130 at the upper edge of the display panel DP is also lowered by the force of the driving unit 140, which lowers the display panel DP together with the links 121. That is, the driving unit 140 applies force to the head bar 130, the upper link 121U, and one end of the lower link 121D connected to the upper link 121U. The driving unit 140 applies the force to one end of the lower link 121D to rotate the lower link 121D with respect to the support shaft 124, thereby lowering the lower link 121D and the upper link 121U.

Further, the lifting unit 150 causes rotation of the other end of the lower link 121D with respect to the support shaft 124 that tends to lift the lower link 121D and the upper link 121U. The head bar 130 and the display panel DP connected to the lower link 121D and the upper link 121U may also be lifted by the force of the lifting unit 150. That is, the lifting unit 150 applies the force to the other end of the lower link 121D to rotate the lower link 121D with respect to the support shaft 124, which lifts the upper link 121U and the lower link 121D connected to the upper link 121U.

In summary, when the display panel DP is wound or manipulated to the rolled configuration, the driving unit 140 applies force to one end of the lower link 121D so that one end of the lower link 121D rotates with respect to the support shaft 124, folding in the process. The lifting unit 150 applies force to the other end of the lower link 121D such that the other end of the lower link 121D rotates with respect to the support shaft 124 towards the unfolded configuration.

In this case, a length from one end of the lower link 121D proximate the top edge 105 of the display panel DP to the support shaft 124 may be longer than a length from the other end of the lower link 121D proximate bottom edge 103 of the display panel DP to the support shaft 124. Further, it is known that the farther a point where the force is applied is with respect to another point, such as the support shaft 124, the smaller the force is needed to generate the same torque and rotate the lower link 121D. Specifically, the lower link 121D is a body of rotation which rotates with respect to the support shaft 124 by torque. The torque may be determined by multiplying the length from the support shaft 124 to the point where the force is applied by a magnitude of the applied force. Therefore, the longer the length between the point where the force is applied and the support shaft 124, the larger the torque. Because the length from the top edge 105 of the display panel DP to the support shaft 124 is greater than the length from the bottom edge 103 of the display panel to the support shaft 124, a smaller force applied by the driving unit 140 to the top edge 105 of the display panel DP generates more torque than a large force applied by the elastic member 151 to the bottom edge 103 of the display panel DP and as such, the display panel DP is wound around the roller 111 and the links 121 are manipulated to the folded configuration.

For example, the length from one end of the lower link 121D to the support shaft 124 is larger than the length from the other end of the lower link 121D to the support shaft 124. Therefore, even though the force of the driving unit 140 which is applied to one end of the lower link 121D is smaller than the force of the lifting unit 150 applied to the other end of the lower link 121D, the torque at the one end of the lower link 121D may be stronger, as above. As such, even though the force of the driving unit 140 is smaller than the force of the lifting unit 150, the driving unit 140 manipulates the lower link 121D to the folded state. Therefore, when the display panel DP is manipulated to the folded configuration, the driving unit 140 applies the force so as to lower the lower link 121D and the lifting unit 150 applies the force to lift the lower link 121D, which is opposite to the driving unit 140. Because the torque applied by the driving unit 140 to one end of the lower link 121D is larger than the torque applied to the other end of the lower link 121D by the lifting unit, the lower link 121D is lowered together with the display panel DP.

Therefore, the force of the driving unit 140 and the force of the lifting unit 150 and the elastic member may be selected in consideration of a length from the support shaft 124 to one end of the lower link 121D and the length from the support shaft 124 to the other end of the lower link 121D.

In one embodiment, in the fully unrolled configuration, a length from one end of the elastic member 151 to the other end of the elastic member 151 is a second length D2. Specifically, in the fully unrolled configuration, the elastic member 151 is contracted a maximum amount. Therefore, the second length D2 is a minimum length of the elastic member 151.

Specifically, in the fully unrolled configuration, the elastic member 151 is contracted by the driving unit 140 and the lifting unit 150. The other end of the elastic member 151 is fixed to the elastic member fixing unit 152 and one end of the elastic member 151 may move in accordance with the rotation of the lower link 121D. In this case, as described above, in the fully unrolled configuration, the driving unit 140 fixes the roller 111 so as to prevent rotation of the roller 111, which prevents the display panel DP from winding around the roller 111 and lowering the display panel DP. Further, the force from the driving unit 140 is not applied to the plurality of links 121, which prevents the links 121 from being manipulated to the folded state by the driving unit 140. Therefore, the plurality of links 121 remain the unfolded state to the maximum by the lifting unit 150, which exerts a lifting force on the links due to the contraction of the elastic element 151 and its tendency to return to its uncontracted state. In this case, the other end of the lower link 121D rotates with respect to the support shaft 124 so as to be closer to the center area of the display panel DP, which the lower link 121D vertical with respect to the bottom surface HPF of the housing unit HP. One end of the elastic member 151 connected to the other end of the lower link 121D may also move closer to the center area of the display panel DP, which contracts the elastic member 151. Therefore, before the driving unit 140 applies the force to lower the display panel DP, the elastic member 151 is not expanded by the driving unit 140, but rather, is contracted to be back to its original state so that the elastic member 151 has the second length D2, which is the minimum length.

In one embodiment, when the driving unit 140 rotates the roller 111 to wind the display panel DP again, the elastic member 151, which is contracted to the maximum in the fully unrolled configuration, is expanded again by the force of the driving unit 140 applied to the elastic member 151. Therefore, one end of the elastic member 151 may move away from the elastic member fixing unit 152 with respect to the other end of the elastic member 151 fixed to the elastic member fixing unit 152. In other words, one end of the elastic member 151 may move away from the center area of the display panel DP.

Therefore, when the display panel DP is wound, the driving unit 140 rotates the other end of the lower link 121D of the plurality of links 121 so that the plurality of unfolded links 121 are folded. That is, the driving unit 140 rotates the other end of the lower link 121D to lower the plurality of links 121.

The other end of the lower link 121D rotates away from the center area of the display panel DP via the force applied by the driving unit 140. Further, the lower link 121D rotates with respect to the support shaft 124 by the rotation of the other end of the lower link 121D and for example, in one embodiment, the lower link 121D rotates until the lower link 121D is horizontal relative to the bottom surface HPF of the housing unit HP.

Therefore, when the display panel DP is wound around the roller 111, the driving unit 140 rotates the roller 111 to wind the display panel DP around the roller 111 and the elastic member 151 is expanded by the force of the driving unit 140 which rotates the lower link 121D away from the center of the display panel DP. As the elastic member 151 expands, one end of the elastic member 151 moves away from the center area of the display panel DP and the other end of the lower link 121D connected to one end of the elastic member 151 also rotates away from the center area of the display panel DP. Therefore, the lower link 121D and the upper link 121U connected to the lower link 121D are lowered.

The display device 100 according to the exemplary embodiment of the present disclosure includes the driving unit 140. The driving unit 140 directly rotates the roller 111 to precisely control the roller 111. Specifically, the display device 100 according to the embodiments of the present disclosure includes the driving unit 140 coupled to any one of both ends of the roller 111 at the outside of the roller 111.

The driving unit 140 is a member which generates a torque and the torque generated in the driving unit 140 may rotate the roller 111 in either the clockwise or counterclockwise directions. In this case, the display panel DP fixed to the roller 111 may be wound or unwound around the roller 111 in accordance with the rotating direction of the roller 111. The driving unit 140 display panel controls a speed or rate at which the display panel DP is wound around the roller 111 or unwound from the roller 111 by precisely controlling rotation of the roller 111. The lifting unit 150 is also connected to an upper portion of the display panel DP to apply the force so as to lift the display panel DP while maintaining the display panel DP in a flat and planar configuration. However, operation of the lifting unit 150 is dependent on whether the driving unit 140 fixes the roller 111 or rotates the roller 111. That is, even though the force is applied from the lifting unit 150 to lift the display panel DP, the driving unit 140 rotates the roller 111 to wind and lower the display panel DP. Therefore, even though the force from the lifting unit 150 is applied to the display panel DP and the plurality of links 121, the display device 100 according to the exemplary embodiment of the present disclosure may sufficiently rotate the roller 111 in both directions or may fix the roller 111 with the force of the driving unit 140 and control the display panel DP and the plurality of links 121. Put another way, the fixing force applied by the driving unit 140 controls operation of the lifting unit 150, as the fixing force holds the links in the unfolded or folded state, which results in the display panel DP remaining the unrolled or rolled configurations, respectively. When the display panel DP is manipulated to the unrolled configuration, the force exerted by the lifting unit 150 assists in raising the display panel DP.

The display device 100 according to the exemplary embodiment of the present disclosure includes the lifting unit 150 which is connected to the upper edge 105 of the display panel DP via the links 121 and which maintains the display panel DP in a flat and planar configuration when the display panel DP is in the unrolled configuration. Specifically, the elastic member 151 of the lifting unit 150 is connected to the other end of the lower link 121D at each of the plurality of links 121 to apply force such that the lower link 121D rotates with respect to the support shaft 124. The other end of the lower link 121D rotates with respect to the support shaft 124 via force applied by the elastic member 151 to lift the lower link 121D, in which case, the upper link 121U connected to the lower link 121D is also lifted. Therefore, the head bar 130 connected to the plurality of links 121 is also lifted to lift the display panel DP whose upper edge 105 is fixed to the head bar 130. In this case, while winding or unwinding the display panel DP which display panel is fixed to the roller 111, at least a part including the lower edge of the display panel DP may be wound around the roller 111. In a state in which a lower portion of the display panel DP is fixed to the roller 111 or wound around the roller 111 to be lowered, or unwound from the roller 111, the upper edge of the display panel DP is lifted by the lifting unit 150 at all times. Therefore, at least a part of the display panel DP which is unwound from the roller 111 is lifted by the lifting unit 150 and maintained in a flat and planar state.

A degree of flatness of the display panel DP may be selected by adjusting the lifting unit 150 and the degree of flatness of the display panel DP may be selected by adjusting the force of the lifting unit 150. For example, when the elastic member 151 of the lifting unit 150 is a spring, the degree of flatness of the display panel DP may be adjusted only by selecting a constant or other characteristics of the spring. Therefore, the lifting unit 150 of the display device 100 according to the exemplary embodiment of the present disclosure applies force so as to continuously lift at least a part of the display panel DP which is unwound from the roller 111 to maintain the flat state of the display panel DP. Moreover, embodiments of the present disclose enable selectively adjusting the force of the lifting unit 150 to adjust the degree of flatness of the display panel DP by selecting a different elastic element 151.

The display device 100 according to the present disclosure simplifies a configuration for winding or unwinding the display panel DP to reduce the volume of the display device 100. Specifically, the display device 100 includes the roller 111 and the plurality of links 121, which assist with winding and unwinding (or rolling and unrolling) of the display panel DP and which support the display panel DP in a flat and planar state. The roller 111 and the plurality of links 121 are members to which force is applied in order to be operated. In this case, force is applied to the roller 111 from the driving unit 140 to rotate the roller 111 and wind or unwind the display panel DP. Further, force is applied to the plurality of links 121 from the lifting unit 150 to lift the plurality of links 121 and support the display panel DP in the flat and planar state when the display panel DP is in any configuration, rolled or unrolled. In this case, the driving unit 140 is directly connected to the roller 111 so that the force of the driving unit 140 is directly applied to the roller 111 without using an intermediate medium which transmits the force from the driving unit 140. The lifting unit 150 is directly connected to the plurality of links 121 so that the force of the lifting unit 150 is directly applied to the plurality of links 121 without using an intermediate medium which transmits the force from the lifting unit 150. Therefore, the driving unit 140 directly applies the force to the roller 111 and the lifting unit 150 directly applies the force to the plurality of links 121 so that the intermediate medium which transmits the force may be omitted. Therefore, the display device 100 according to the present disclosure simplifies the configuration of the display device 100, which reduces the number of parts or components, which reduces cost and also reduces the volume occupied by the display device 100.

The display device 100 according to the embodiments of the present disclosure disposes the driving unit 140 and the lifting unit 150 at the outside of the roller 111 to increase the degree of freedom of design of the driving unit 140 and the lifting unit 150. In the related art, the elastic member is disposed in the roller so that the size of the elastic member is restricted and it is not easy to repair or replace the elastic member. In contrast, in the display device 100 according to the embodiments of the present disclosure, the driving unit 140 is connected to the roller 111 at the outside of the roller 111 and the lifting unit 150 is connected to the plurality of links 121 at the outside of the roller 111. Therefore, the size of the roller 111 is not limited and the driving unit 140 may be easily replaced with another driving unit 140 without dissembling the roller 111 or changing its position. The lifting unit 150 is not limited by the size of the roller 111 and the lifting unit 150 may be easily replaced with another lifting unit 150 without dissembling the roller 111 and the plurality of links 121 or move their position. Therefore, in the display device 100 according to the embodiments of the present disclosure, the driving unit 140 and the lifting unit 150 are disposed at the outside of the roller 111 such that the driving unit and the lifting unit can be easily repaired, rearranged, or replaced. Further, because of the reduction in complexity and number of components, design changes to the display device 100 are easier to implement. More specifically, changing the design of the display device 100, such as a size or a curvature of the housing unit HP, the display device 100 may still be implemented with minimum modification, thereby increasing the degree of freedom of design.

Figure 9:
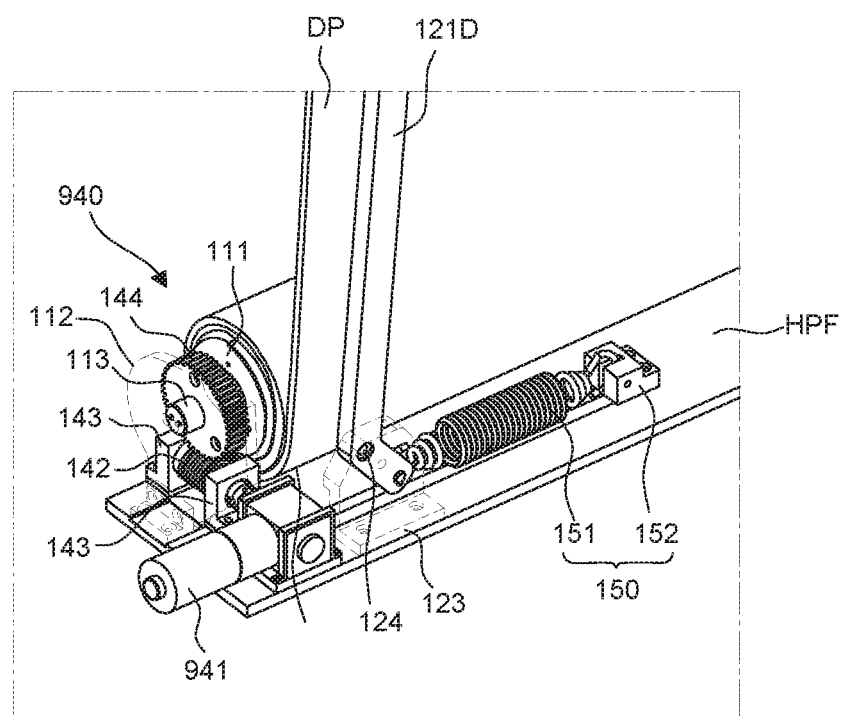
FIG. 9 is an enlarged perspective view for explaining a driving assembly, a roller, an elastic member, and a link of a display device according to an alternative embodiment of the present disclosure.

FIG. 9 is an enlarged perspective view for explaining a driving assembly, a roller, an elastic member, and a link of a display device according to alternative embodiment of the present disclosure. The configuration of the display device 900 of FIG. 9 is the same as that of the display device 100 of FIGS. 1 to 8B except for the differences described below, such as the arrangement of a motor 941 of a driving assembly 940 (which may be referred to hereinafter as a driving unit 940). As such, redundant description has been omitted.

Referring to FIG. 9, the driving unit 940 is disposed at the outside of the roller 111 and connected to the roller 111. Specifically, in one embodiment, the driving unit 940 is positioned adjacent to any one of both ends of the roller 111 and connected to the roller 111.

A motor 941 of the driving unit 940 is not vertically erected from the bottom surface HPF of the housing unit HP, but is positioned on the bottom surface HPF of the housing unit HP. For example, the motor 941 rotates toward the bottom surface HPF of the housing unit HP with respect to the worm gear 142 so that the side of the motor 941 is opposite to the bottom surface HPF of the housing unit HP. Since the motor 941 is positioned on the bottom surface HPF, a height of the motor 941 from the bottom surface HPF of the housing unit HP is reduced.

In the display device 900, the arrangement of the driving unit 940 is modified to lower a height of the housing unit HP and to reduce a volume of the housing unit HP. Specifically, the display device 900 according to one embodiment of the present disclosure does not arrange the motor 941 of the driving unit 940 erected, but rather, the motor 941 is laid on the bottom surface HPF of the housing unit HP. Therefore, the height of the motor 941 from the bottom surface HPF of the housing unit HP is lowered. Therefore, the height of the housing unit HP which is designed in consideration of the height of the motor 941 is also reduced and thus the volume of the housing unit HP is also reduced. Therefore, the display device 900 according to one embodiment of the present disclosure includes a design of the driving unit 940 to reduce the volume of the display device 900.

Further, the display device 900 according to the present disclosure includes various designs, arrangements, and orientations of the driving unit 940. In one embodiment, the driving unit 940 is disposed at the outside of the roller 111 and connected to the roller 111. Therefore, in order to change the design of the driving unit 940, the driving unit 940 may be modified without changing the size of the roller 111 or the arrangement of the roller 111. For example, the driving unit 940 may be arranged erected or laid on the bottom surface HPF. Because the driving unit 940 is outside of the roller 111, the driving unit 940 may be easily repaired and replaced regardless of the roller 111 and the remaining components of the display device 900, which increases design freedom for the device 900. In sum, the embodiments of the present disclosure can be described as follows:

According to one or more embodiments of the present disclosure, there is provided a display device. The display device includes a display panel, a roller to which a lower edge of the display panel is fixed, a plurality of links having one end connected to an upper edge of the display panel, a driving unit which is disposed at the outside of the roller to rotate the roller, and an elastic member which is connected to the other end of each of the plurality of links to be disposed at the outside of the roller.

The driving unit may be connected to at least one of both ends of the roller to rotate the roller in a clockwise direction or a counterclockwise direction.

Each of the plurality of links may be connected to the upper edge of the display panel through a head bar.

Each of the plurality of links may include a lower link having the other end coupled to the elastic member, and an upper link having one end rotatably coupled to the upper edge of the display panel and the other end rotatably coupled to one end of the lower link.

The lower link may be rotatably coupled to a support shaft, and the elastic member may rotate the other end of the lower link around the support shaft to lift the lower link.

One end of the elastic member may be rotatably coupled to the other end of the lower link, and a length of the elastic member in a fully wound state of the display panel may be longer than a length of the elastic member in a fully unwound state of the display panel.

The elastic member may have an elastic force which rotates the other end of the lower link to lift each of the plurality of links.

In a fully unwound state of the display panel, the plurality of links may be disposed to be vertical to the upper edge of the display panel, the other end of the lower link may be disposed to be closer to the lower edge of the display panel than the one end of the lower link, and the other end of the upper link may be disposed to be closer to the lower edge of the display panel than one end of the upper link.

In a fully wound state of the display panel, the plurality of links may be disposed to be horizontal to the upper edge of the display panel, the other end of the lower link may be disposed to be farther from a center area of the display panel than the one end of the lower link, and the other end of the upper link may be disposed to be closer to the center area of the display panel than one end of the upper link.

The length from the support shaft to the other end of the lower link may be shorter than the length from the support shaft to the one end of the lower link.

While winding the display panel, the driving unit may rotate the roller with a force smaller than a force of the elastic member which lifts the plurality of links.

While winding the display panel, the driving unit may rotate the one end of the lower link around the support shaft to lower the lower link.

According to another embodiment of the present disclosure, there is provided a rollable display device. The rollable display device includes a roller, a display panel fixed to the roller, a plurality of links which supports the display panel to be flat, a driving unit which rotates the roller and a lifting unit which applies a force to the plurality of links. The display panel is wound by the roller which rotates by the driving unit and is unwound by the roller which rotates by the driving unit and the plurality of links which is unfolded by the lifting unit.

Each of the plurality of links may include a lower link having the other end applied with a force from the lifting unit and an upper link whose the other end is rotatably coupled to one end of the lower link to transmit the force from the driving unit to one end of the lower link, and the lower link may rotate around a support shaft. A length from the support shaft to the one end of the lower link may be longer than a length from the support shaft to the other end of the lower link.

While winding the display panel, a force of the driving unit may be smaller than a force of the lifting unit and a torque applied to the one end of the lower link may be larger than a torque applied to the other end of the lower link.

While winding the display panel, the driving unit may apply the force so as to lower the display panel and the lifting unit may apply the force to lift the display panel, and while unwinding the display panel, the driving unit and the lifting unit may apply the force to lift the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. The embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a display panel having a first edge and a second edge;
    a roller coupled to the first edge of the display panel;
    a plurality of links having a first end opposite a second end, each of the second ends of the plurality of links coupled to the display panel proximate the second edge of the display panel;
    a driving assembly coupled to the roller and disposed outside of the roller and configured to apply a force to the roller to rotate the roller; and
    an elastic member coupled to the first end of each of the plurality of links and disposed outside of the roller.

2. The display device according to claim 1, wherein the roller includes opposing ends and the driving assembly is coupled to at least one of the opposing ends of the roller, wherein the driving assembly is configured to rotate the roller in a clockwise direction or a counterclockwise direction.

3. The display device according to claim 1 further comprising:
    a head bar coupled to the second edge of the display panel, wherein each of the second ends of the plurality of links are coupled to the head bar.

4. The display device according to claim 1, wherein each of the plurality of links includes:
    a first link having the first end coupled to the elastic member; and
    a second link rotatably coupled to the first link and having the second end coupled to the display panel proximate the second edge of the display panel.

5. The display device according to claim 4 further comprising:
    a support shaft, the first link of each of the plurality of links rotatably coupled to the support shaft, wherein the elastic member is configured to exert a force on the first end of the first link to rotate the first link about the support shaft to lift the first link towards a vertical orientation.

6. The display device according to claim 5, wherein an end of the elastic member is rotatably coupled to the first end of the first link, wherein a length of the elastic member when the display panel is in a fully rolled configuration is greater than a length of the elastic member when the display panel is in a fully unrolled configuration.

7. The display device according to claim 5, wherein the elastic member is configured to exert an elastic force on the first link which rotates the first end of the first link to lift each of the plurality of links.

8. The display device according to claim 4, wherein when the display panel is in a fully unrolled configuration, the plurality of links are vertical relative to the second edge of the display panel, and the first end of the first link is positioned closer to the first edge of the display panel than a second end of the first link, and a first end of the second link is positioned closer to the first edge of the display panel than the second end of the second link.

9. The display device according to claim 4, wherein when the display panel is in a fully rolled configuration, the plurality of links are arranged horizontal relative to the second edge of the display panel, and the first end of the first link is positioned farther from a center area of the display panel than a second end of the first link, and a first end of the second link is positioned closer to the center area of the display panel than the second end of the second link.

10. The display device according to claim 5, wherein a length from the support shaft to the first end of the first link is less than a length from the support shaft to a second end of the first link.

11. The display device according to claim 10, wherein the driving assembly is configured to rotate the roller with a first force and the elastic member is configured to exert a second force on the plurality of links less than the first force.

12. The display device according to claim 10, wherein the driving assembly is configured to rotate the first end of the first link about the support shaft to lower the first link.

13. A rollable display device, comprising:
    a roller;
    a display panel fixed to the roller;
    a plurality of links coupled to the display panel, the plurality of links configured to support the display panel in a flat and planar configuration;
    a driving assembly mechanically coupled to the roller; and
    a lifting assembly configured to apply a force to the plurality of links,
    wherein during operation, the driving assembly:
        applies a force to the roller to rotate the roller to wind or unwind the display panel about the roller, and
    wherein during operation, the lifting assembly:

acts with the force on the plurality of links to unfold the plurality of links.

14. The rollable display device according to claim 13, wherein each of the plurality of links includes:
a lower link having an other end, wherein the lifting assembly is configured to apply the force to the other end of the lower link;
an upper link with an other end that is rotatably coupled to a one end of the lower link, wherein the driving assembly is configured to exert a force on the upper link, the upper link configured to transmit the force from the driving assembly to the one end of the lower link; and
a support shaft, the lower link configured to rotate about the support shaft, wherein a length from the support shaft to the one end of the lower link is greater than a length from the support shaft to the other end of the lower link.

15. The rollable display device according to claim 14, wherein the force of the driving assembly is less than the force of the lifting assembly and a torque corresponding to the force of the driving assembly on the one end of the lower link is greater than a torque corresponding to the force of the lifting assembly on the other end of the lower link.

16. The rollable display device according to claim 13, wherein the driving assembly is configured to exert a force on the roller to lower the display panel and the lifting assembly is configured to simultaneously apply the force to lift the display panel.

17. The rollable display device according to claim 13 wherein the driving assembly is configured to exert a force on the roller to lift the display panel and the lifting assembly is configured to apply a force to lift the display panel.

18. A device, comprising:
a roller;
a display panel coupled to the roller;
a plurality of links coupled to the display panel;
a driving assembly coupled to the roller, the driving assembly configured to apply a first force to rotate the roller in a clockwise or a counterclockwise direction; and
a lifting assembly coupled to the plurality of links, the lifting assembly configured to exert a second force on the plurality of links to lift the plurality of links.

19. The device of claim 18 wherein the first force is less than the second force in either the clockwise or the counterclockwise direction.

20. The device of claim 19 wherein the lifting assembly is configured to generate a first torque on the plurality of links corresponding to the second force and the driving assembly is configured to generate a second torque on the plurality of links corresponding to the first force, the first torque being less than the second torque.

* * * * *